United States Patent
Tamai (10) Patent No.: US 7,863,961 B2
(45) Date of Patent: Jan. 4, 2011

(54) VEHICLE COMMUNICATION SYSTEM

(75) Inventor: Yasuhiro Tamai, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 1354 days.

(21) Appl. No.: 11/237,945

(22) Filed: Sep. 29, 2005

(65) Prior Publication Data

US 2006/0066358 A1 Mar. 30, 2006

(30) Foreign Application Priority Data

Sep. 30, 2004 (JP) .............................. 2004-287812

(51) Int. Cl.
*H03K 5/08* (2006.01)

(52) U.S. Cl. ...................... 327/325; 706/905; 706/913; 340/904

(58) Field of Classification Search ................. 706/903, 706/905, 913; 340/904; 327/314, 320, 325, 327/326
See application file for complete search history.

(56) References Cited

U.S. PATENT DOCUMENTS

2004/0201405 A1 * 10/2004 Bacha et al. ................. 327/156
2006/0006918 A1 * 1/2006 Saint-Laurent .............. 327/295

FOREIGN PATENT DOCUMENTS

| GB | 2229872 A | * | 3/1990 |
| GB | 2229872 A | * | 10/1990 |
| JP | 62-225044 |   | 10/1987 |
| JP | 03-186020 |   | 8/1991 |
| JP | 07-131974 |   | 5/1995 |
| JP | 2000-22508 |   | 1/2000 |
| JP | 2000-151153 |   | 5/2000 |
| JP | 2002-261780 |   | 9/2002 |
| JP | 2003-66697 |   | 3/2003 |
| JP | 2004-86398 |   | 3/2004 |
| JP | 2004-252963 |   | 9/2004 |

OTHER PUBLICATIONS

The Office Action mailed Nov. 4, 2009 from the Japanese Intellectual Property Office for counterpart Japanese Patent Application No. 2004-287812.

* cited by examiner

*Primary Examiner*—Long Nguyen
(74) *Attorney, Agent, or Firm*—Finnegan, Henderson, Farabow, Garrett & Dunner, L.L.P.

(57) ABSTRACT

An ECU serving as a transmission side and an ECU serving as a reception side are coupled to each other through communication lines and junction connectors. A diode in which a direction directed from a negative-side output terminal of the ECU serving as the transmission side to a positive-side output terminal thereof becomes a forward direction is provided between the positive-side output terminal and the negative-side output terminal.

2 Claims, 6 Drawing Sheets

VEHICLE COMMUNICATION SYSTEM

BACKGROUND OF THE INVENTION

1. Field of the Invention

The present invention relates to a vehicle communication system for performing data communication between respective ECUs mounted on a vehicle.

2. Description of the Related Art

In recent years, as electronic instrumentation mounted on a vehicle has been increased, a large number of ECUs (electronic control units) have been provided in the vehicle. Moreover, in order for the ECUs to perform data communication to each other, communication lines for data transmission are cabled between the respective ECUs, and junction connectors (hereinafter, referred to as "J/Cs") for branching the communication lines are provided.

Figure 1:
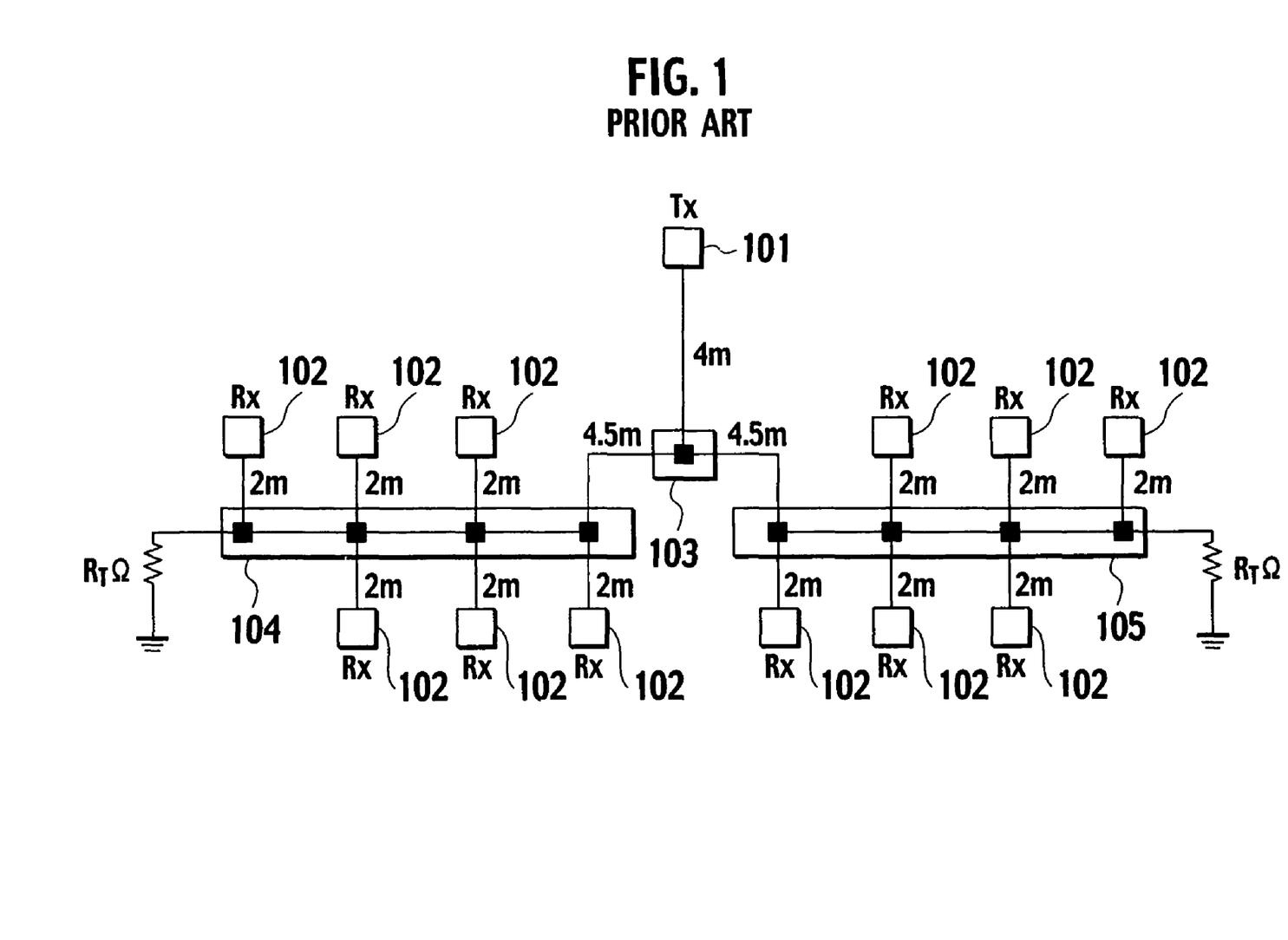
FIG. 1 is a circuit diagram showing a construction of a conventional vehicle communication system.

FIG. 1 is an explanatory view showing a construction of a conventional vehicle communication system. As shown in this drawing, in the vehicle communication system, a J/C 103 is coupled to an ECU 101 serving as a starting point. A communication line branches into two lines through the J/C 103, and the branch lines are coupled to a J/C 104 and a J/C 105, respectively.

Six ECUs 102 are coupled to each of the J/C 104 and the J/C 105, and moreover, junction points in the J/C 104 and junction points in the J/C 105 are grounded through termination resistors $R_T$, respectively. Furthermore, a length of the communication line that couples the ECU 101 serving as the starting point and the J/C 103 is set at 4 m, lengths of the communication lines between the J/C 103 and the J/C 104 and between the J/C 103 and the J/C 105 are set at 4.5 m, and lengths between the J/C 104 and the respective ECUs 102 and between the J/C 105 and the respective ECUs 102 are set at 2 m. In the drawing, Tx represents transmission and Rx represents reception.

In the vehicle communication system constructed as described above, in the case where signals are transmitted from the ECU 101 serving as the starting point to the respective ECUs 102, so-called ringing in which a signal waveform largely oscillates in the vertical direction sometimes occurs when the signals are switched from an ON state (dominant) to an OFF state (recessive).

Figure 2:
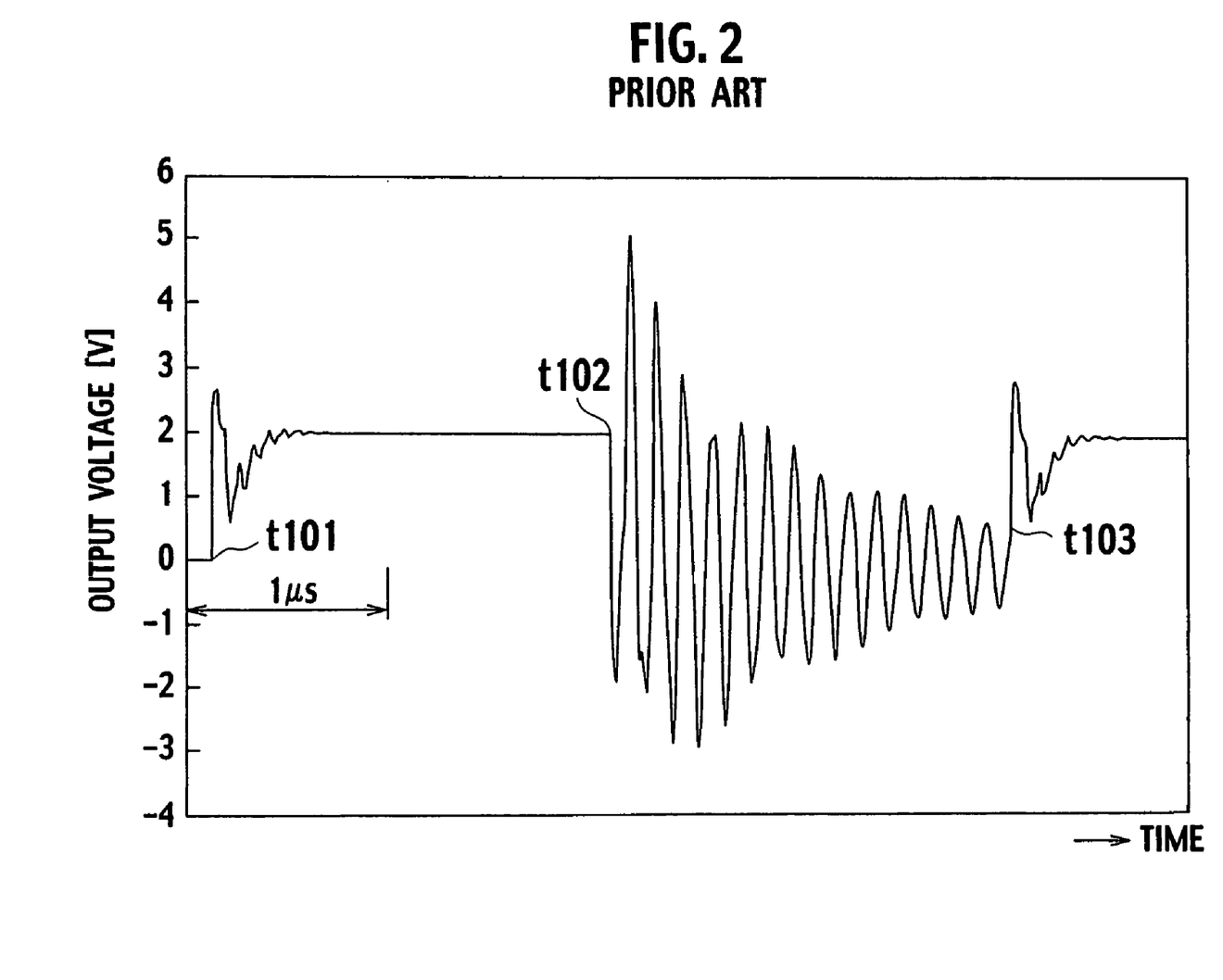
FIG. 2 is a characteristic view showing amplitudes of the ringing that occurs in the case of using the conventional vehicle communication system.

FIG. 2 is a characteristic view showing a signal waveform generated in the communication line connected to the ECU 101 when the signal is transmitted from the ECU 101 of FIG. 1. In FIG. 2, when an output of the transmission signal is switched from the OFF state to the ON state at time t101, such an output signal of the ECU 101 reaches a predetermined voltage level, and a desired signal is transmitted to the other ECU 102.

Moreover, when the output of the transmission signal is switched from the ON state to the OFF state at time t102, though the output is turned off, a signal waveform thereof largely oscillates in the vertical direction owing to the ringing, and the oscillation is left until time t103 when the output is turned on the next time.

When the ringing as described above occurs, an error occurs in the communication signals between the ECU 101 and the respective ECUs 102, causing a problem that communication accuracy is lowered. Moreover, the ringing does not always occur. Characteristic impedance is changed depending on various conditions including the lengths of the communication lines connecting the ECUs and J/Cs to each other, sizes of the termination resistors $R_T$ coupled to the J/Cs 104 and 105, and the number of ECUs 102 coupled to the J/Cs 104 and 105. From the above, it is possible that the ringing occurs to a large extent and that the ringing does not occur at all depending on the magnitude of the characteristic impedance.

Hence, conditions where the ringing does not occur is estimated to some extent, and positions of the ECUs 101 and 102 and the J/Cs 103 to 105, the lengths of the communication lines, and the like in the vehicle are determined, thus making it possible to prevent the occurrence of the ringing. However, actually, the ringing sometimes occurs because the lengths of the communication lines are varied for each vehicle on which the ECUs, J/Cs, and the communication lines are mounted, other ECUs are additionally provided, and so on, varying the characteristic impedance.

In this connection, as a method of surely preventing the occurrence of the ringing, for example, as described in Japanese Patent Laid-Open Publication No. 2000-151153, there has been proposed a method of restricting the variations of the characteristic impedance by individually connecting drivers to respective bus lines in order to drive the bus lines.

SUMMARY OF THE INVENTION

However, in a system described in the above Patent Document, it is necessary to individually mount the drivers on the respective bus lines, and accordingly, there is a problem that a size of the system becomes large, leading to a cost increase.

The present invention has been created in order to solve the conventional problem described above. It is an object of the present invention to provide a vehicle communication system capable of preventing an occurrence of ringing with a simple construction.

In order to achieve the above-described object, a first aspect of the present invention is summarized to be a vehicle communication system, including: a transmission node; a reception node coupled to the transmission node through communication lines and branching means; and a diode in which a direction directed from a negative-side output terminal of the transmission node to a positive-side output terminal thereof becomes a forward direction, the diode being disposed between the positive-side output terminal and the negative-side output terminal.

According to the first aspect of the present invention, the diode is disposed to be connected to the output terminal of the transmission node, and voltage oscillating to the negative side is thus short-circuited and consumed. Accordingly, the occurrence of the ringing can be restricted.

In addition to the diode, the vehicle communication system may further include: a Zener diode in which the direction directed from the negative-side output terminal of the transmission node to the positive-side output terminal thereof becomes the forward direction, the Zener diode being disposed between the positive-side output terminal and the negative-side output terminal.

With the above-described construction, the Zener diode is disposed to be connected to the output terminal of the transmission node, and the voltage oscillating to the positive side is short-circuited and consumed. Accordingly, the occurrence of the ringing can be further reduced.

Zener voltage becoming reverse voltage when the Zener diode conducts in a reverse direction may be set at a higher value than a value of positive voltage of a transmission signal outputted from the transmission node.

With the above-described construction, the Zener voltage of the Zener diode is set higher than the positive voltage of the transmission signal outputted from the transmission node, and accordingly, only the voltage caused by the ringing can be surely consumed without attenuating the transmission signal.

In order to achieve the above-described object, a second aspect of the present invention is summarized to be a vehicle communication system, including: a transmission node; a reception node coupled to the transmission node through communication lines and branching means; and a Zener diode in which a direction directed from a negative-side output terminal of the transmission node to a positive-side output terminal thereof becomes a forward direction, the Zener diode being disposed between the positive-side output terminal and the negative-side output terminal.

According to the second aspect of the present invention, the Zener diode is disposed to be connected to the output terminal of the transmission node, and the voltage oscillating to the positive side is thus short-circuited and consumed. Accordingly, the occurrence of the ringing can be restricted.

Zener voltage becoming reverse voltage when the Zener diode conducts in a reverse direction may be set at a higher value than a value of positive voltage of a transmission signal outputted from the transmission node.

With the above-described construction, the Zener voltage of the Zener diode is set higher than the positive voltage of the transmission signal outputted from the transmission node. Accordingly, only the voltage caused by the ringing can be surely consumed without attenuating the transmission signal.

DETAILED DESCRIPTION OF THE PREFERRED EMBODIMENT

First and second embodiments of the present invention are described below based on the drawings. In the following description based on the drawings, the same or similar reference numerals are assigned to the same or similar portions.

Moreover, the first and second embodiments to be described below show, as examples, a system and a method for embodying a technical idea of this invention. The technical idea of this invention does not limit materials, shapes, structures, arrangements, and the like of constituent parts to ones to be described below. Various alterations can be added to the technical idea of this invention within the range of the scope of claims.

First Embodiment

A first embodiment of the present invention is described below.

Figure 3:
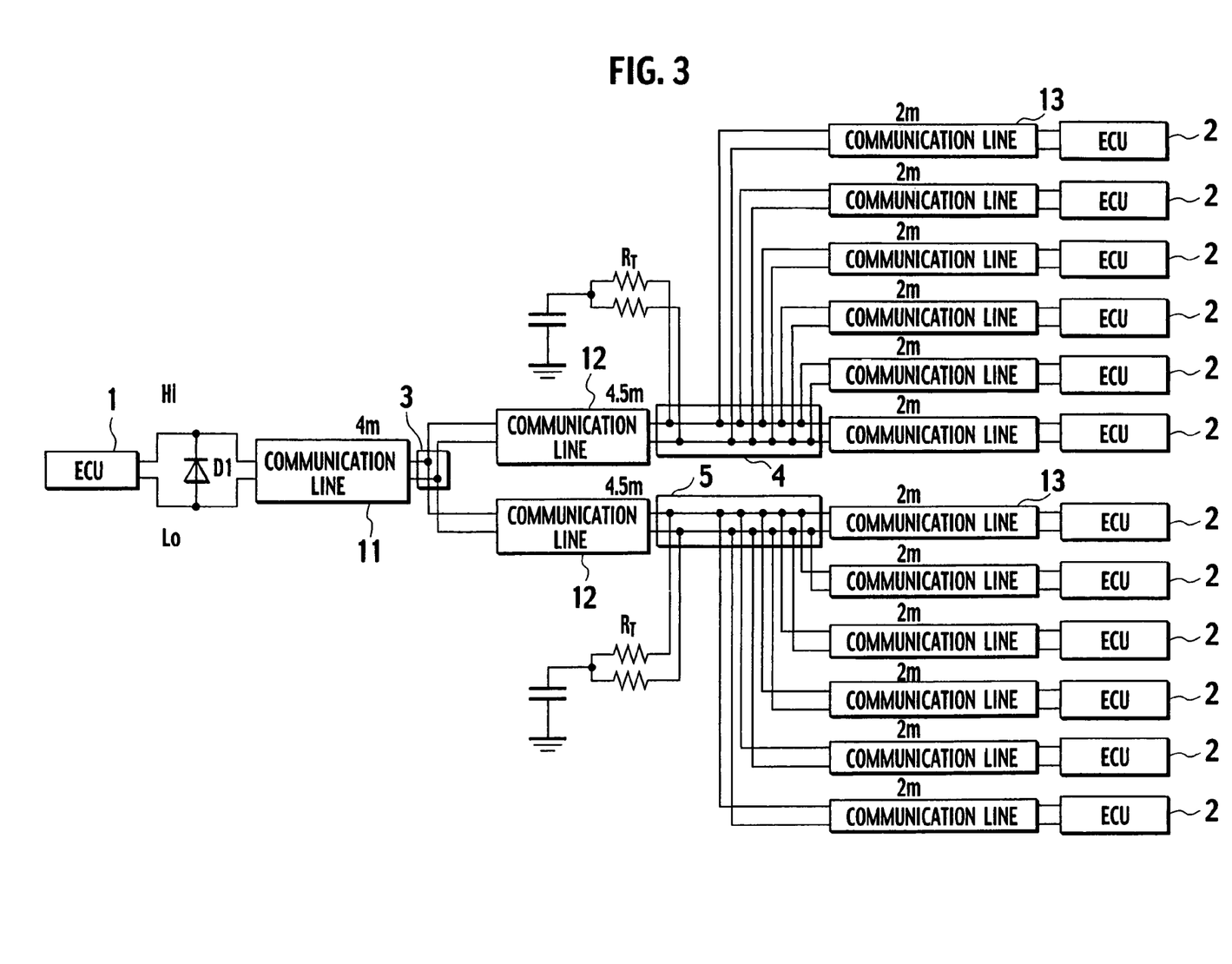
FIG. 3 is a circuit diagram showing a construction of a vehicle communication system according to a first embodiment of the present invention.

FIG. 3 is an explanatory view showing a construction of a vehicle communication system according to the first embodiment of the present invention. As shown in this drawing, this vehicle communication system performs data communication between an ECU (transmission node) 1 serving as a starting point and other respective ECUs (reception nodes) 2. The ECU 1 is connected to a junction connector (branching means; hereinafter, referred to as a "J/C") 3 through a communication line 11. The J/C 3 branches a communication line into two lines and a J/C 4 and a J/C 5 are connected through communication lines 12.

Each of the J/C 4 and the J/C 5 is coupled to six ECUs 2 through communication lines 13. Junction points in the J/C 4 and junction points in the J/C 5 are grounded through termination resistors $R_T$ and capacitors.

Moreover, a length of the communication line that couples the ECU 1 serving as the starting point and the J/C 3 is set at 4 m, lengths of the communication lines 12 between the J/C 3 and the J/C 4 and between the J/C 3 and the J/C 5 are set at 4.5 m, and lengths between the J/C 4 and the respective ECUs 2 and between the J/C 5 and the respective ECUs 2 are set at 2 m.

Furthermore, between a positive-side output terminal (denoted by "Hi" in the drawing) of the ECU 1 and a negative-side output terminal (denoted by "Lo" in the drawing) thereof, a diode D1 is disposed. The diode D1 is disposed so that a direction directed from the negative-side output terminal to the positive-side output terminal can become a forward direction. Here, for the diode D1, used is one with an ON voltage of 0.8V, that is, one having characteristics of conducting when a forward voltage becomes 0.8V or more.

Next, functions of the first embodiment of the present invention, which is constructed as described above, are described. When a transmission signal is outputted from the ECU 1, such an output signal is transmitted to the respective ECUs 2 through the communication line 11, the J/C 3, the communication lines 12, the J/Cs 4 and 5, and the communication lines 13.

Figure 4:
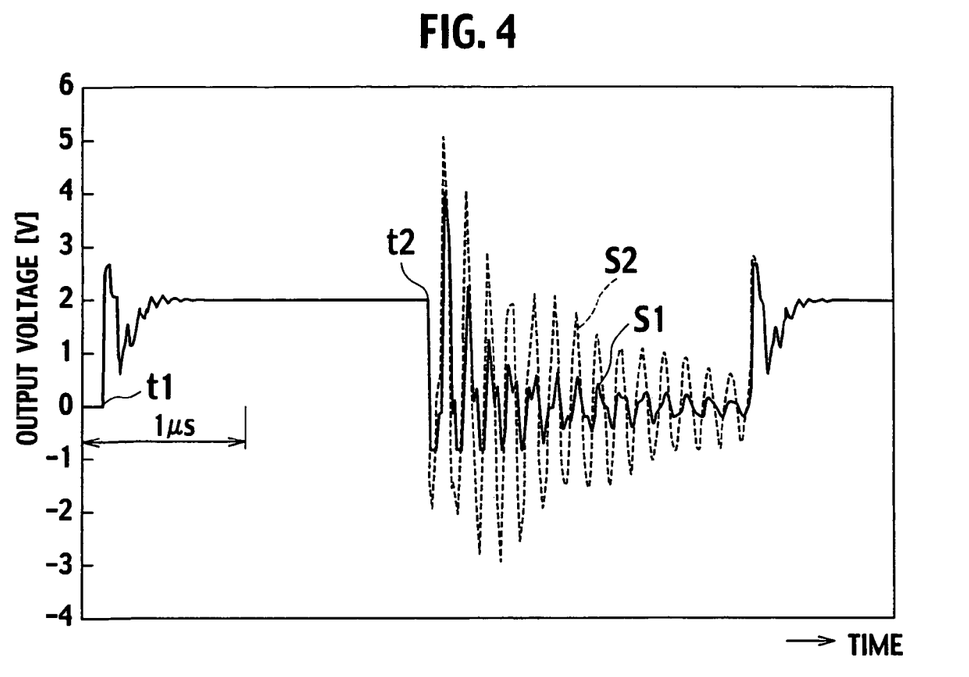
FIG. 4 is a characteristic view showing amplitudes of the ringing in the case of using a diode in which an ON resistance is 0.8V, wherein a curve S1 represents amplitude of the first embodiment of the present invention, and a curve S2 represents amplitude of the conventional example.

FIG. 4 is an explanatory view showing signal waveforms generated in the communication line 11 when the transmission signal is outputted from the ECU 1, in which a horizontal axis represents a time, and a longitudinal axis represents a voltage level. Here, a characteristic curve denoted by reference numeral S1 of FIG. 4 represents the case of employing the first embodiment of the present invention, and a characteristic curve denoted by reference numeral S2 in this graph represents the case of not employing this embodiment (that is, the curve shown in FIG. 2).

When the transmission of the signal from the ECU 1 is switched from an OFF state to an ON state at time t1 in FIG. 4, the transmission of the signal from the ECU 1 is started. Thereafter, when the transmission is switched off at time t2, in the case of the conventional example shown by the curve S2, ringing in which the voltage signal largely oscillates in the vertical direction occurs. However, in the case of the first embodiment of the present invention, as shown by the curve S1, the amplitude of the ringing is restricted to be small.

Specifically, in the first embodiment of the present invention, the diode D1 is provided, and a current flows in a direction from the negative-side output terminal of the ECU 1 to the positive-side output terminal thereof. Accordingly, voltage oscillating to the negative side can be consumed, and amplitude of the ringing in the negative direction can be restricted. In particular, as seen from the characteristic curve. S2, immediately after the transmission of the signal is switched from the ON state to the OFF state, the ringing first oscillates to the negative direction, and thereafter, oscillates as in the positive, negative, positive . . . directions. Hence, by restricting the first oscillation to the negative direction, the occurrence of the ringing can be prevented effectively.

As described above, in the vehicle communication system according to the first embodiment of the present invention, the diode D1 is provided between two output terminals of the ECU 1 so that the direction directed from the negative-side output terminal to the positive-side output terminal can be the forward direction. Accordingly, the voltage generated on the negative side can be consumed, and the occurrence of the ringing can be restricted.

In such a way, an occurrence of noise and an occurrence of a communication error can be prevented, thus making it possible to significantly enhance communication accuracy. Moreover, in the first embodiment of the present invention, as an example, description has been made of the case of using the diode D1 with the ON resistance of 0.8V. However, the smaller the ON resistance is, the more rapidly the voltage generated on the negative side can be consumed. Accordingly, the ringing can be further reduced in this case. As a modification example of the first embodiment of the present invention, a diode D1 with the ON resistance of 0.3V may be used.

Figure 5:
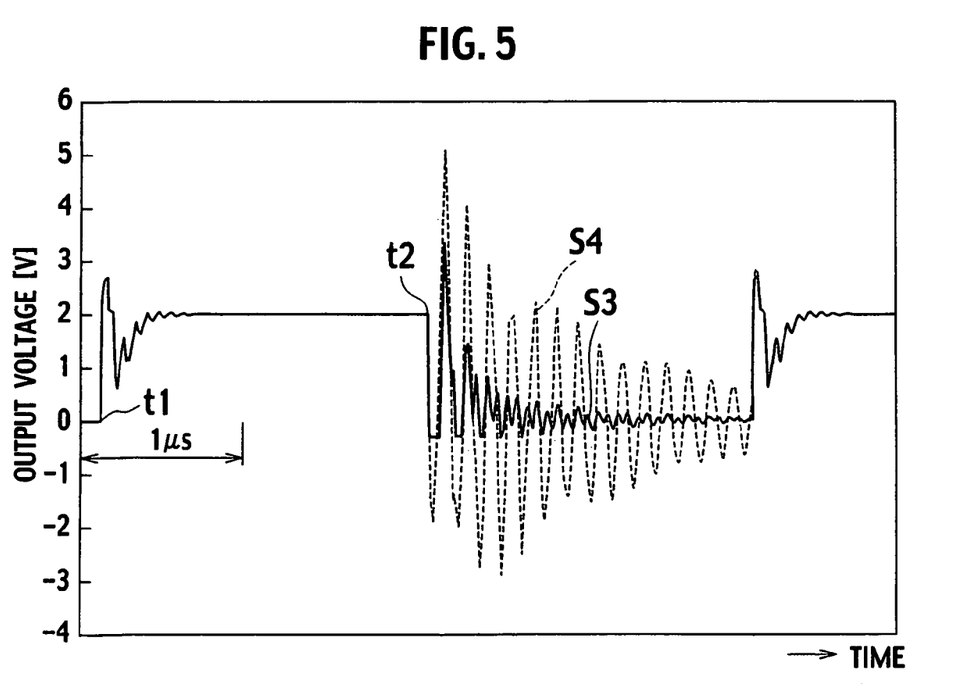
FIG. 5 is a characteristic view showing amplitudes of the ringing in the case of using a diode in which the ON resistance is 0.3V, wherein a curve S3 represents the amplitude of a modification example of the first embodiment of the present invention, and a curve S4 represents the amplitude of the conventional example.

FIG. 5 is an explanatory view showing signal waveforms generated in the communication line 11 when the transmission signal is outputted from the ECU 1, in which a horizontal axis represents a time, and a longitudinal axis represents a voltage level. FIG. 5 shows characteristics in the case of using the diode D1 with the ON resistance of 0.3V, in which a curve S3 represents the modification example of the first embodiment of the present invention, and a curve S4 represents the conventional example. As seen from this graph, in the curve S3, the ringing is restricted significantly as compared with that in the curve S4. Further, also in the case of making comparison with the curve S1 of FIG. 4, the ringing is restricted more effectively in the curve S3.

Second Embodiment

Next, a vehicle communication system according to the second embodiment of the present invention is described.

Figure 6:
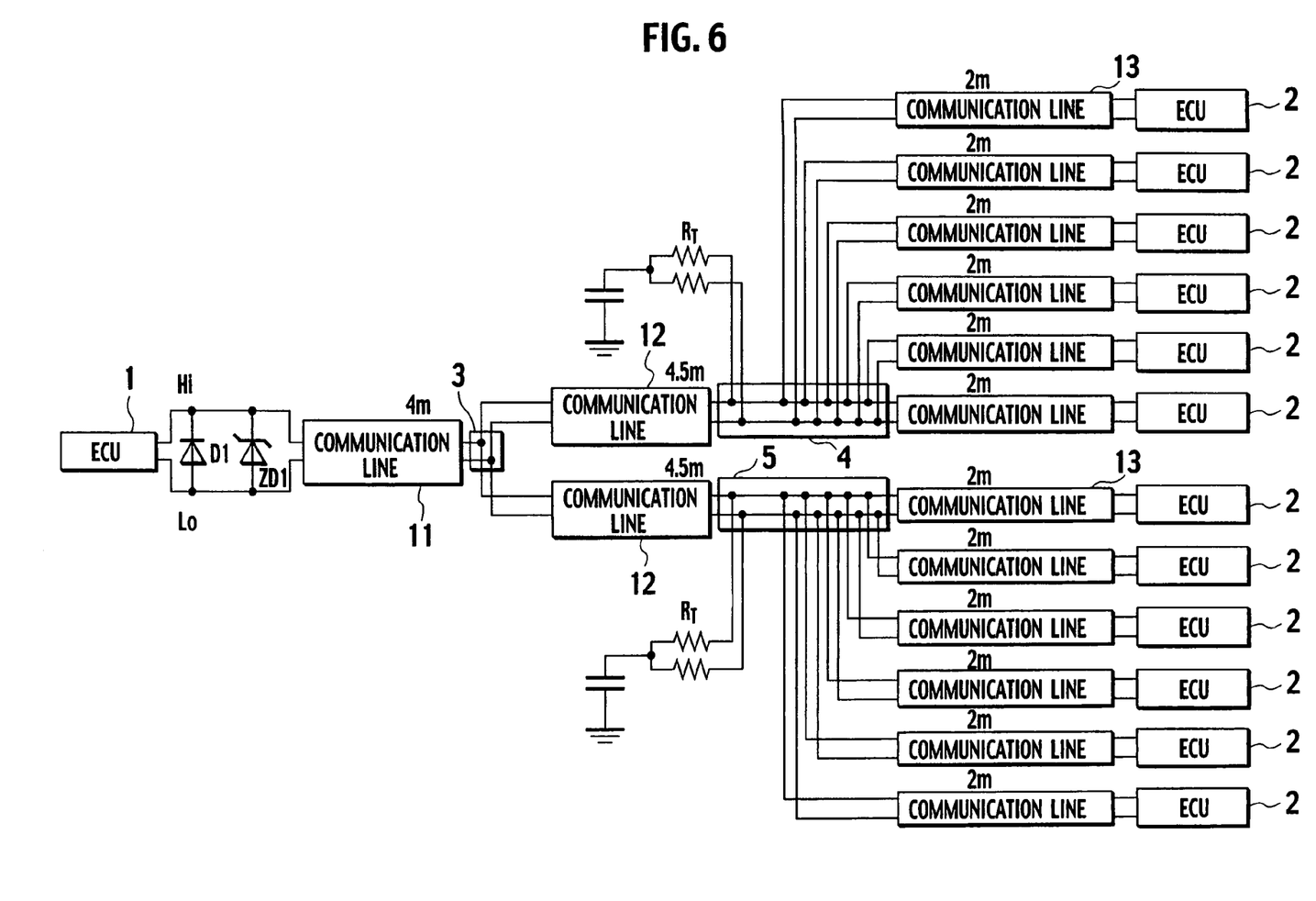
FIG. 6 is a circuit diagram showing a construction of a vehicle communication system according to a second embodiment of the present invention.

FIG. 6 is an explanatory view showing a construction of the vehicle communication system according to the second embodiment of the present invention. In comparison with the system shown in the above-described first embodiment, the system of the second embodiment is different therefrom in that a Zener diode ZD1 is provided parallel to the diode D1. Moreover, the Zener diode ZD1 is disposed so that the direction directed from the negative-side output terminal to the positive-side output terminal can become the forward direction. Other constructions are similar to those of FIG. 3. Accordingly, the same reference numerals are assigned to such similar constituents, and description of constructions thereof are omitted.

Here, Zener voltage (reverse voltage when the Zener diode ZD1 conducts in the reverse direction) of the Zener diode ZD1 is set at 2.4V.

Figure 7:
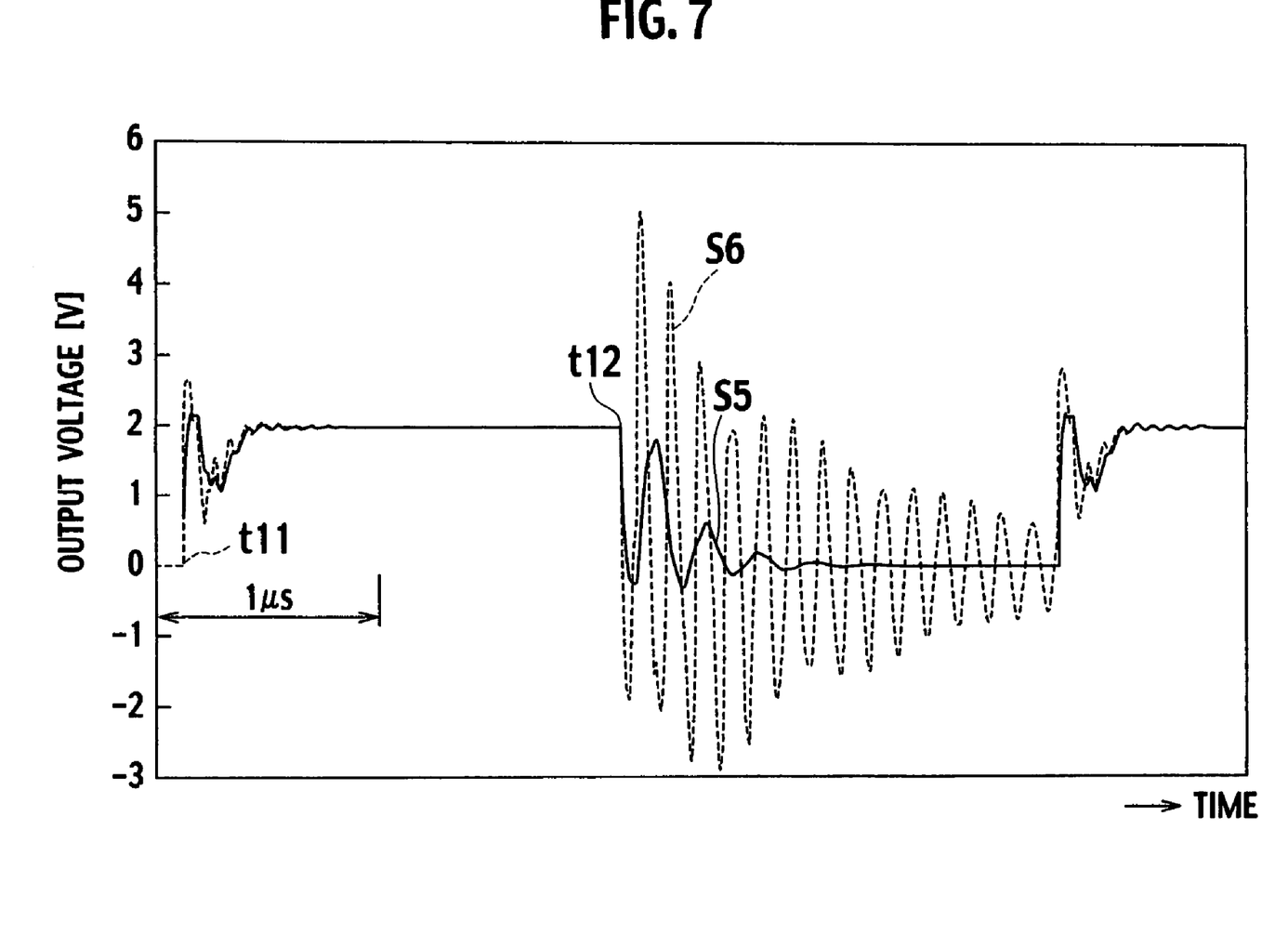
FIG. 7 is a characteristic view of amplitudes of the ringing, wherein a curve S5 represents the amplitude of the second embodiment of the present invention, and a curve S6 represents the amplitude of the conventional example.

FIG. 7 is an explanatory view showing signal waveforms generated in the communication line 11 when the transmission signal is outputted from the ECU 1, in which a horizontal axis represents a time, and a longitudinal axis represents a voltage level. Then, a characteristic curve shown by reference numeral S5 of FIG. 7 represents the case of employing the second embodiment of the present invention, and a characteristic curve shown by reference numeral S6 of this drawing represents the case of not employing the second embodiment of the present invention (that is, the curve shown in FIG. 2).

When the transmission of the signal from the ECU 1 is switched from the OFF state to the ON state at time t11 in FIG. 7, the transmission of the signal from the ECU 1 is started. Thereafter, when the transmission is switched off at time t12, in the case of the conventional example shown by the curve S6, the ringing in which the voltage signal largely oscillates in the vertical direction occurs. However, in the case of employing the second embodiment of the present invention, the amplitude of the ringing is restricted to be small.

Moreover, in comparison with the characteristic curve S1 in the case of the first embodiment of the present invention (in the case where only the diode D1 is provided), which is shown in FIG. 4, the amplitude of the ringing is further restricted to be small.

Specifically, in the second embodiment of the present invention, the Zener diode ZD1 is provided in addition to the diode D1, and when the voltage of the positive-side output terminal of the ECU 1 exceeds the Zener voltage (2.4V in this example) of the Zener diode ZD1, the current flows in a direction directed from the positive-side output terminal to the negative-side output terminal. As a result, positive voltage of 2.4V or more can be consumed, and the amplitude of the ringing in the positive direction can be restricted.

Hence, a positive component and negative component of the ringing, which occur when the transmission signal is switched from the ON state to the OFF state, can be restricted. Accordingly, the occurrence of the ringing can be prevented more effectively, and the occurrence of the noise and the occurrence of the communication error can be further prevented. In such a way, in comparison with the first embodiment, the communication accuracy can be further enhanced.

Moreover, as shown in FIG. 7, voltage of the transmission signal transmitted from the ECU 1 at a usual time is approximately 2V, and with respect thereto, the Zener voltage of the Zener diode ZD1 is set at 2.4V. Specifically, the Zener voltage is set larger than the output voltage of the transmission signal. In such a way, the transmission signal is not short-circuited by the Zener diode ZD1, and the signal transmission can be made surely.

Furthermore, the first embodiment has been described by taking as an example the case of providing the diode D1, and the second embodiment has been described by taking as an example the case of arranging the diode D1 and the Zener diode ZD1 parallel to each other. However, the present invention is not limited to these, and it is also possible to adopt a construction of providing only the Zener diode ZD1 (that is, a circuit construction of removing the diode D1 from FIG. 6).

With such a construction, though the restriction effect of the ringing oscillating in the negative direction is lowered because the diode D1 does not exist, the ringing oscillating in the positive direction can be restricted by the Zener diode ZD1. Accordingly, as a result, the restriction effect of the ringing can be obtained.

Moreover, also in this case, it is desirable that the Zener voltage of the Zener diode ZD1 be made larger than the output voltage of the transmission signal at the usual time.

Although the present invention has been described by the first and second embodiments, the present invention is not limited to these, and the constructions of the respective portions can be replaced by arbitrary constructions having similar functions.

What is claimed is:

1. A vehicle communication system, comprising:
    a transmission node which starts a signal transmission when switching from an OFF state to an ON state;
    a reception node connected to the transmission node and receiving the signal transmitted through a plurality of communication lines;
    a junction connector electrically coupled to the plurality of transmission lines and branching the signal into multiple channels;
    a grounding means electrically coupled to the junction connector and providing a electrical path to ground;
    a diode in which a direction directed from a negative-side output terminal of the transmission node to a positive-side output terminal thereof becomes a forward direction, the diode being disposed between the positive-side output terminal and the negative-side output terminal; and
    a Zener diode in which a direction directed from the negative-side output terminal to the positive-side output terminal becomes a forward direction, a direction from the positive-side output terminal to the negative-side output terminal becomes a reverse direction, and a Zener voltage becomes a reverse voltage when the Zener diode conducts in the reverse direction, in addition to the diode, the Zener diode being disposed between the positive-side output terminal and the negative-side output terminal,
        wherein the Zener voltage is set at a higher value than a normal value of a positive voltage of a transmission signal outputted from the transmission node such that a positive ringing voltage generated when the transmission node is switched from the OFF state to the ON state is restricted to be lower than the normal value of the positive voltage of the transmission signal.

2. A vehicle communication system, comprising:
    a transmission node which starts a signal transmission when switching from an OFF state to an ON state;
    a reception node connected to the transmission node and receiving the signal transmitted through a plurality of communication lines;
    a junction connector electrically coupled to the plurality of transmission lines and branching the signal into multiple channels;
    a grounding means electrically coupled to the junction connector and providing a electrical path to ground; and
    a Zener diode in which a direction directed from a negative-side output terminal of the transmission node to a positive-side output terminal thereof becomes a forward direction, a direction from the positive-side output terminal to the negative-side output terminal becomes a reverse direction, and a Zener voltage becomes a reverse voltage when the Zener diode conducts in the reverse direction, the Zener diode being disposed between the positive-side output terminal and the negative-side output terminal,
        wherein the Zener voltage is set at a higher value than a normal value of a positive voltage of a transmission signal outputted from the transmission node such that a positive ringing voltage generated when the transmission node is switched from the OFF state to the ON state is restricted to be lower than the normal value of the positive voltage of the transmission signal.

* * * * *

UNITED STATES PATENT AND TRADEMARK OFFICE
CERTIFICATE OF CORRECTION

PATENT NO. : 7,863,961 B2  
APPLICATION NO. : 11/237945  
DATED : January 4, 2011  
INVENTOR(S) : Yasuhiro Tamai

Page 1 of 1

It is certified that error appears in the above-identified patent and that said Letters Patent is hereby corrected as shown below:

In claim 1, column 7, line 15, "a electrical" should read --an electrical--.

In claim 2, column 8, line 15, "a electrical" should read --an electrical--.

Signed and Sealed this
Twenty-sixth Day of June, 2012

David J. Kappos
*Director of the United States Patent and Trademark Office*